United States Patent
Wang et al.

(10) Patent No.: US 11,262,398 B2
(45) Date of Patent: Mar. 1, 2022

(54) TESTING FIXTURE AND TESTING ASSEMBLY

(71) Applicant: NANYA TECHNOLOGY CORPORATION, New Taipei (TW)

(72) Inventors: Ching-Chung Wang, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 152 days.

(21) Appl. No.: 16/670,134

(22) Filed: Oct. 31, 2019

(65) Prior Publication Data
US 2021/0132138 A1 May 6, 2021

(51) Int. Cl.
| G01R 1/04 | (2006.01) |
| G01R 1/067 | (2006.01) |
| G01R 1/073 | (2006.01) |
| G01R 31/26 | (2020.01) |
| G01R 31/28 | (2006.01) |

(52) U.S. Cl.
CPC ....... *G01R 31/2808* (2013.01); *G01R 1/0408* (2013.01)

(58) Field of Classification Search
CPC ........ G01R 1/04; G01R 1/0408; G01R 1/067; G01R 1/073; G01R 31/02; G01R 31/26; G01R 31/2808
See application file for complete search history.

(56) References Cited

U.S. PATENT DOCUMENTS

| 5,838,159 A * | 11/1998 | Johnson ............... G01R 1/0483 324/754.08 |
| 5,982,185 A * | 11/1999 | Farnworth ........... G01R 1/0483 324/537 |
| 6,163,160 A | 12/2000 | Haurahan et al. |
| 2015/0253358 A1 * | 9/2015 | Chen ....................... G01R 3/00 29/825 |

FOREIGN PATENT DOCUMENTS

| TW | 201105976 A1 | 2/2011 |
| TW | M-425281 U | 3/2012 |
| TW | M-464664 U | 11/2013 |

OTHER PUBLICATIONS

Office Action dated Mar. 31, 2021 in TW Application No. 109128308, 8 pages.

* cited by examiner

*Primary Examiner* — Neel D Shah
(74) *Attorney, Agent, or Firm* — Muncy, Geissler, Olds & Lowe, P.C.

(57) ABSTRACT

The present disclosure provides a testing fixture. The testing fixture includes a carrier, a plurality of sets of electrical lines and a plurality of electrical lines. The carrier includes a base and a frame extending along an upper surface of the base. The base and the frame define a first recess, a second recess extending longitudinally from the first recess, and a third recess extending transversely from the first recess. The plurality of sets of electrical contacts are disposed on the base and arranged in a rotationally symmetrical manner, and the electrical lines are electrically connected to the plurality of sets of electrical contacts.

16 Claims, 11 Drawing Sheets

TESTING FIXTURE AND TESTING ASSEMBLY

TECHNICAL FIELD

The present disclosure relates to a carrier for holding a device under test (DUT) and an assembly including the carrier and the DUT, and more particularly, to a testing fixture for holding a printed circuit board (PCB) mounted with electronic components and an assembly including the testing fixture and the PCB.

DISCUSSION OF THE BACKGROUND

The assembly and population of a printed circuit board require many placement, soldering, and other process steps. Therefore, testing and inspection are vital to the economical fabrication of a high-quality product. This is especially true as chip circuit densities, I/O densities, and surface mount technologies drive up printed circuit board circuit loadings. Faults can have their origin in the component chips and bare boards, in component insertion, or in soldering. The faults themselves can be incorrect values or labels, poor circuit performance, open circuits, short circuits, components in incorrect position, physical damage, improper solder, damaged or open lands, or out-of-tolerance faults.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a testing fixture. The testing fixture includes a base, a frame extending along an upper surface of the base, a plurality of sets of electrical contacts and a plurality of electrical lines. The base and the frame define a first recess, a second recess extending longitudinally from the first recess, and a third recess extending transversely from the first recess. The plurality of sets of electrical contacts are disposed on the base and arranged in a rotationally symmetrical manner. The plurality of electrical lines are electrically connected to the plurality of sets of electrical contacts.

In some embodiments, the second recess is separated from the third recess.

In some embodiments, projections of the first recess, the second recess and the third recess on the base intersect at an intersection.

In some embodiments, at least one of the sets of electrical contacts is disposed in the second recess, and at least one of the sets of electrical contacts is disposed in the third recess.

In some embodiments, at least one of the plurality of electrical lines electrically connects at least one electrical contact of one of the plurality of sets of electrical contacts to at least one electrical contact of another one of the plurality of sets of electrical contacts arranged at a corresponding position.

In some embodiments, the electrical contacts have a concave top surface.

In some embodiments, the electrical lines are connected to the upper surface of the base.

In some embodiments, the electrical lines are buried in the base.

In some embodiments, the base and the frame are integrally formed.

Another aspect of the present disclosure provides a testing assembly. The testing assembly includes a device under test (DUT) and a testing fixture. The DUT includes a printed circuit board (PCB), at least one electronic component mounted on the PCB, and a plurality of plated through holes penetrating through the PCB. The testing fixture includes a carrier, a plurality of sets of electrical contacts and a plurality of electrical lines. The carrier includes a base and a frame extending from an upper surface of the base. The base and the frame define a first recess, a second recess extending longitudinally from the first recess, and a third recess extending transversely from the first recess. The plurality of sets of electrical contacts are disposed on the base and arranged in a rotationally symmetrical manner, wherein the electrical contacts are provided at positions corresponding to the plated through holes. The plurality of electrical lines are electrically connected to the plurality of sets of electrical contacts. When the DUT is assembled with the carrier, the DUT occupies the first recess and one of the second recess and the third recess, and at least one the plurality of plated through holes is in contact with one of the electrical contacts.

In some embodiments, the testing fixture further includes a fixed block disposed on the frame and contacts a corner of the PCB in the second recess or the third recess when a thickness of the PCB is greater than a height of the frame.

In some embodiments, the fixed block blocks the corner of the PCB in the second recess and close to the third recess when the DUT occupies the first recess and the second recess, and the fixed block blocks the corner of the PCB in the third recess and close to the second recess when the DUT occupies the first recess and the third recess.

In some embodiments, the testing fixture further includes at least one fastening member locking the fixed block to the frame.

In some embodiments, the second recess is separated from the third recess.

In some embodiments, the electrical lines connect electrical contacts of the plurality of sets of electrical contacts to others of the electrical contacts in corresponding positions.

In some embodiments, projections of the first recess, the second recess and the third recess intersect at an intersection.

In some embodiments, the electrical lines are connected to the upper surface of the base.

In some embodiments, the electrical lines are buried in the base.

With the above-mentioned configurations of the testing fixture including the plurality of sets of electrical contacts arranged in a rotationally symmetrical manner, the DUT can be mounted on the testing fixture in various orientations, which improves the assembly degree of freedom.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
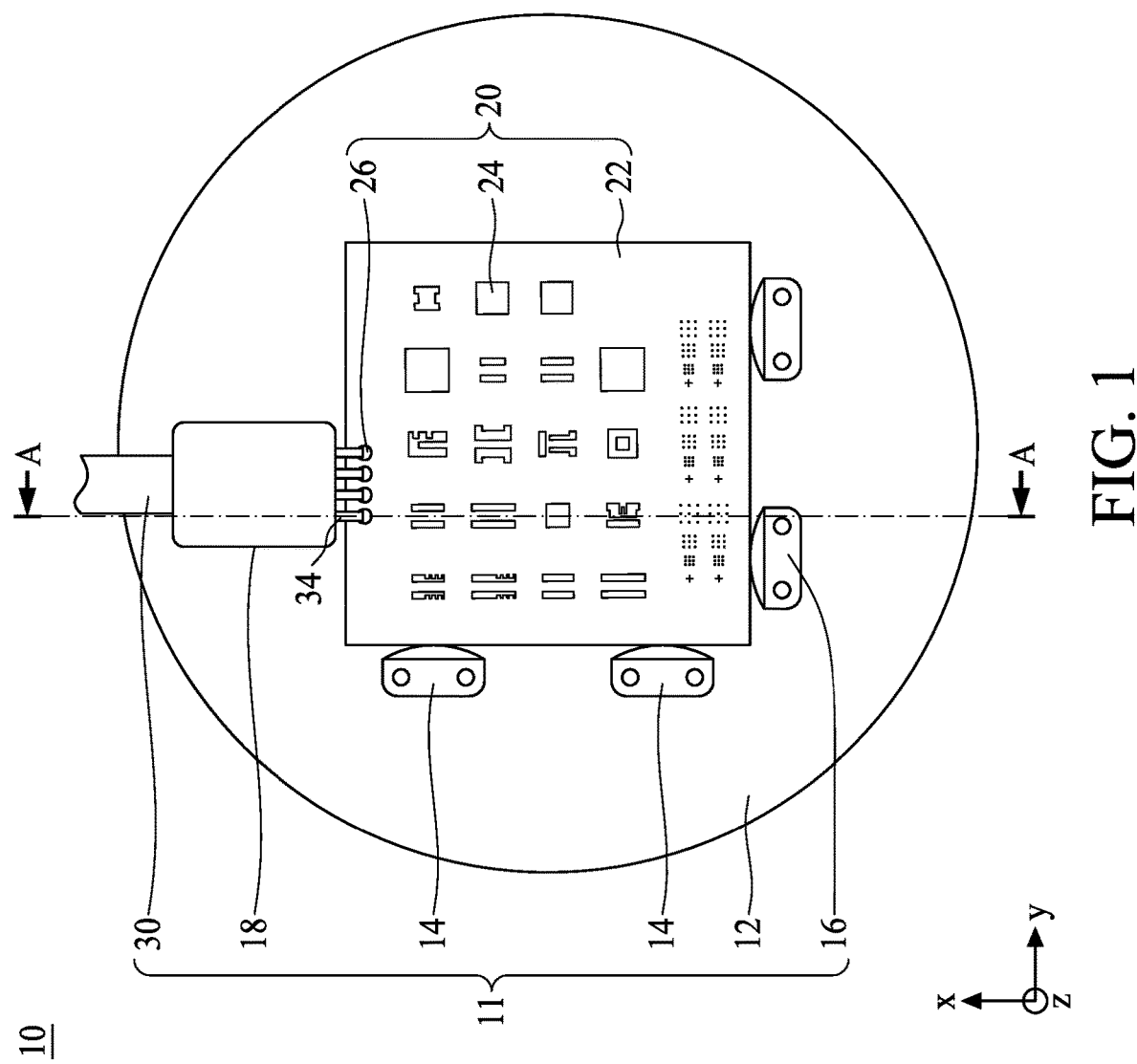
FIG. 1 is a top view of a comparative testing assembly.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
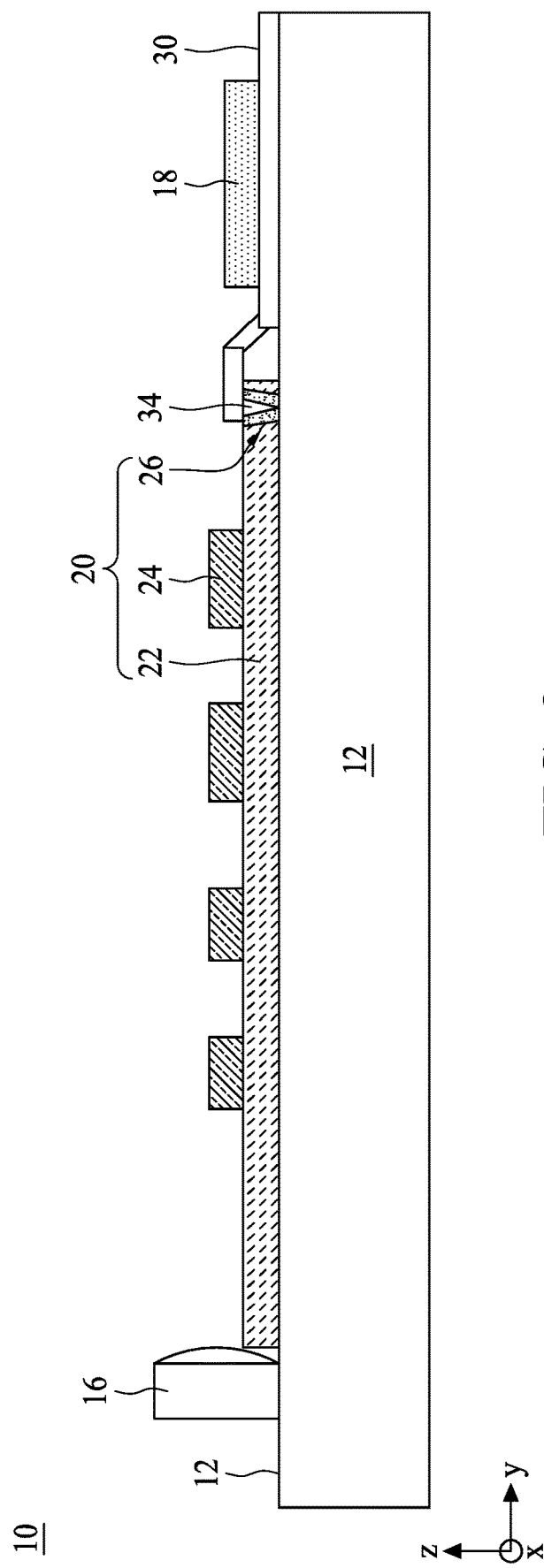
FIG. 2 is a cross-sectional view taken along the line A-A illustrated in FIG. 1.

FIG. 1 is a top view of a comparative testing assembly 10, and FIG. 2 is a cross-sectional view taken along the line A-A illustrated in FIG. 1. Referring to FIGS. 1 and 2, the testing assembly 10 includes a testing fixture 11 and a device under test (DUT) 20, and the testing fixture 11 is used to carry the device under test (DUT) 20, such as a printed circuit board (PCB) 22 mounted with multiple electronic components 24. The DUT 20 further includes a plurality of plated through holes 26 drilled completely through the PCB 22, metallized and electrically coupled to electronic components 24 through electrical traces (not shown) placed on or buried in the PCB 22.

The testing fixture 11 includes a platform 12, a plurality of first stoppers 14 disposed on the platform 12 and equidistantly arranged in a first direction x, a plurality of second stoppers 16 disposed on the platform 12 and equidistantly arranged in a second direction y, and a weight block 18 used to press a cable 30 of a testing probe (not shown) to prevent the cable 30 from being displaced during operation, so as to decrease operation errors. The first stoppers 14 are used to block an edge of the DUT 20 and constrain a movement of the DUT 20 in the second direction y, and the second stoppers 16 are used to block another edge of the DUT 20 and constrain a movement of the DUT 20 in the first direction x perpendicular to the second direction y. A head 34 of the testing probe or the power supply contacts the plated through holes 26 to ensure that the DUT 20 works properly.

In general, the plated through holes 26 are provided at one side of the PCB 22 to increase a footprint for mounting the electronic components 24. As a result, an edge of the PCB 22 formed with the plated through holes 26 needs to be oriented away from the first stoppers 14 and the second stoppers 16 for arranging the cable 30 and installing the head 34 conveniently. However, such requirement makes assembling the DUT 20 with the testing fixture 10 inefficient and inconvenient.

Figure 3:
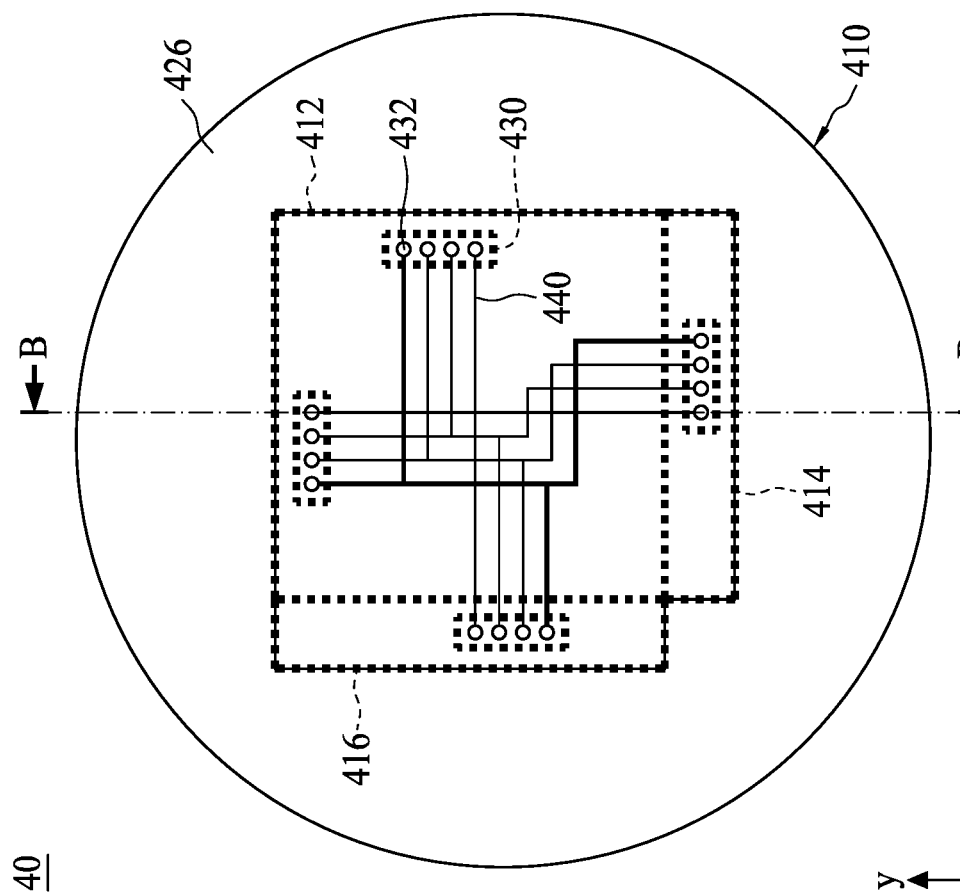
FIG. 3 is a top view of a testing fixture in accordance with some embodiments of the present disclosure.
Figure 4:
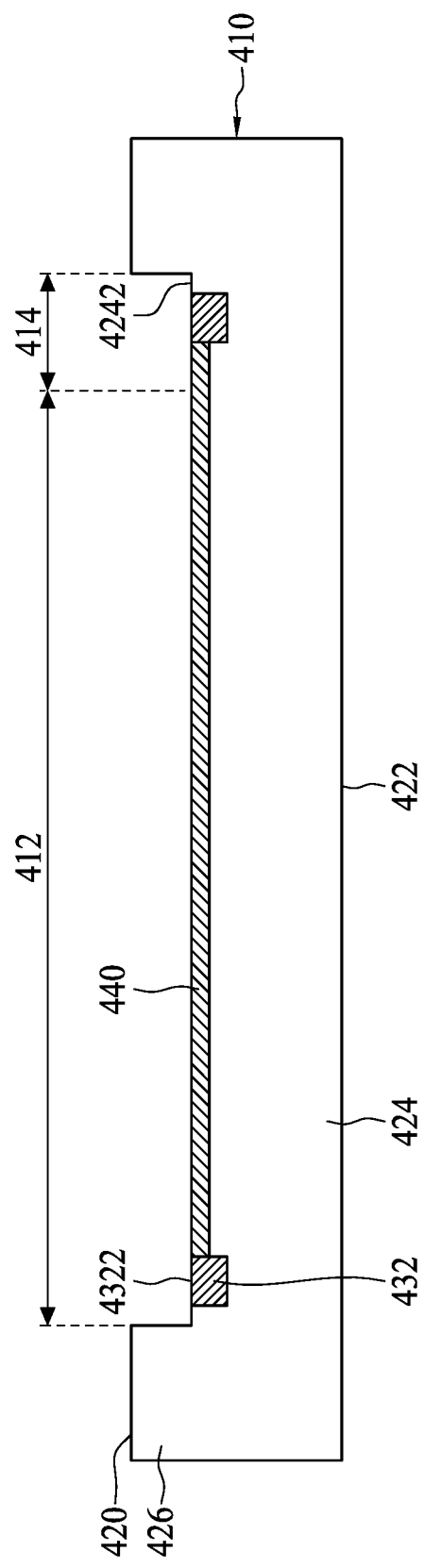
FIG. 4 is a cross-sectional view taken along the line B-B illustrated in FIG. 3.

FIG. 3 is a top view of a testing fixture 40 in accordance with some embodiments of the present disclosure, and FIG. 4 is a cross-sectional view taken along the line B-B illustrated in FIG. 3. Referring to FIGS. 3 and 4, the testing fixture 40 includes a carrier 410, a plurality of sets of electrical contacts 430 disposed on the carrier 410 and arranged in a rotationally symmetrical manner, and a plurality of electrical lines 440 disposed on the carrier 410 and electrically connected to the sets of electrical contacts 430.

In some embodiments, the carrier 410 includes a base 424 and a frame 426 extending along an outer perimeter of an upper surface 4242 of the base 424. The carrier 410 has a first recess 412, a second recess 414 communicating with the first recess 412, and a third recess 416 communicating with the first recess 412 and separated from the second recess 414 by the base 424 and the frame 426. In some embodiments, the second recess 414 extends longitudinally from the first recess 412, and the third recess 416 extends transversely from the first recess 412. In some embodiments, the first recess 412, the second recess 414 and the third recess 416 have concavities facing toward a bottom surface 422 opposite to a top surface 420 of the carrier 410. In some embodiments, the upper surface 4242 is a planar surface, and the top surface 420 and the bottom surface 422 are parallel to the upper surface 4242. The base 424 and the frame 426 may be integrally formed together and made of insulating material, such as polytetrafluoroethylene (PTTE) in some embodiments.

Figure 5:
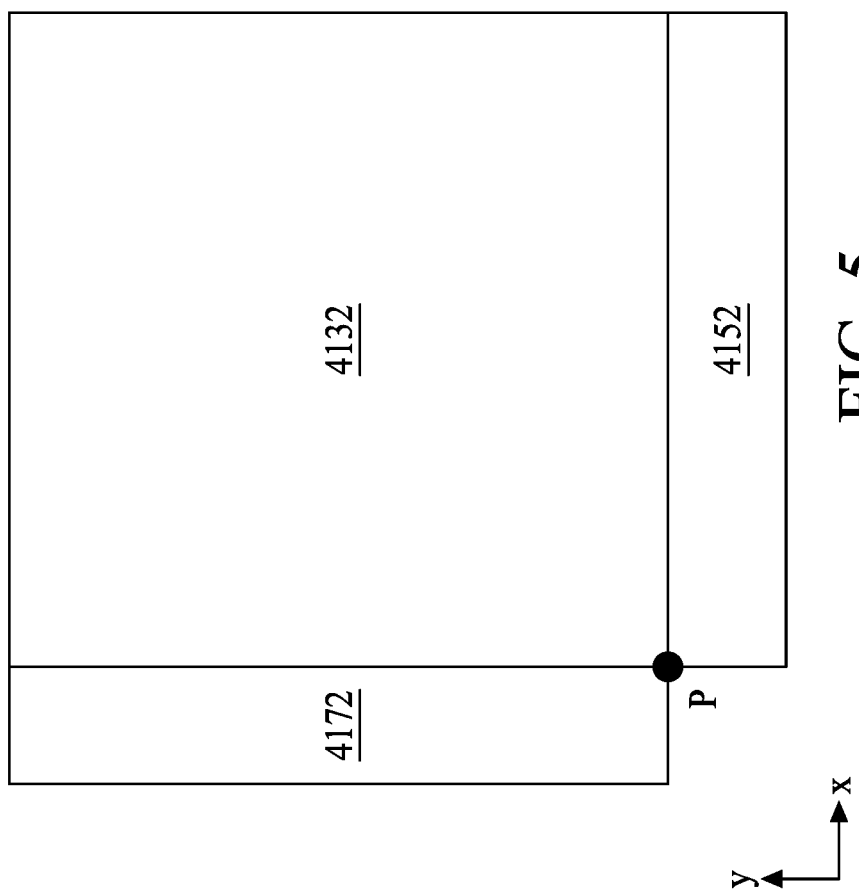
FIG. 5 illustrates projections of a first recess, a second recess and a third recess on a base of the testing fixture.

Referring to FIG. 3, the base 424 has a circular shape, wherein the base 424 may be a 12-inch diameter base in some embodiments. The first recess 412 has a substantially square contour, and the second recess 414 and the third recess 416 have rectangular contours. As shown in FIG. 5, a projection 4132 of the first recess 412 on the base 424 is a square, a projection 4152 of the second recess 414 on the base 424 is a rectangle, and a projection 4172 of the third recess 416 on the base 424 is a rectangle. The projection 4132 includes four equal sides; the projections 4152, 4172 of the second recess 414 and the third recess 416 include two longer sides parallel to each other and two shorter sides parallel to each other and connected to the longer sides. In some embodiments, the longer sides of the projection 4152 of the second recess 414 are parallel to a first direction x, and the shorter sides of the projection 4152 are parallel to a second direction y perpendicular to the first direction x; in addition, the longer sides of the projection 4172 of the third recess 416 are parallel to the second direction y, and the shorter sides of the projection 4172 are parallel to the first direction x.

One of the longer sides of the projection 4152 of the second recess 414 overlaps one side of the projection 4132 of the first recess 412, and one of the longer sides of the projection 4172 of the third recess 416 overlaps another side of the projection 4132 of the first recess 412. The longer sides of the projections 4152, 4172 overlap adjacent sides of the projection 4132. In some embodiments, the longer sides of the projections 4152, 4172 and the overlapped sides of the projection 4132 have a same length, and thus the projections 4132, 4152, and 4172 intersect at an intersection P. In some embodiments, the lengths of the sides of the projection 4132 are about 10.5 cm, and the lengths of the shorter sides of the projections 4152, 4172 are not greater than 1.5 cm.

Referring again to FIGS. 3 and 4, the plurality of sets of electrical contacts 430 are disposed on the base 424. In some embodiments, at least one set of electrical contacts 430 includes a plurality of electrical contacts 432 spaced apart from each other and substantially arranged in a straight line. In some embodiments, the plurality of sets of electrical contacts 430 are arranged along the first direction x or the second direction y. In some embodiments, the electrical contacts 432, made of metallic material, are buried in the base 424, and top surfaces 4322 of the electrical contacts 432 are coplanar with the upper surface 4242 of the base 424.

The electrical lines 440 are disposed on the base 424 and connect to the upper surface 4242. In some embodiments, a number of the electrical lines 440 is equal to a number of the electrical contacts 432 in one set of the electrical contacts 430. For example, the testing fixture 40 includes four electrical lines when one set of the electrical contacts 430 includes four electrical contacts 432. In some embodiments, the electrical line 440 electrically connects one of the electrical contacts 432 in a particular position of one set of electrical contacts 430 to the electrical contacts 432 in corresponding positions in others of the sets of electrical contacts 430. In some embodiments, the electrical lines 440 may be conductors covered with an insulating cladding layer.

Figure 6:
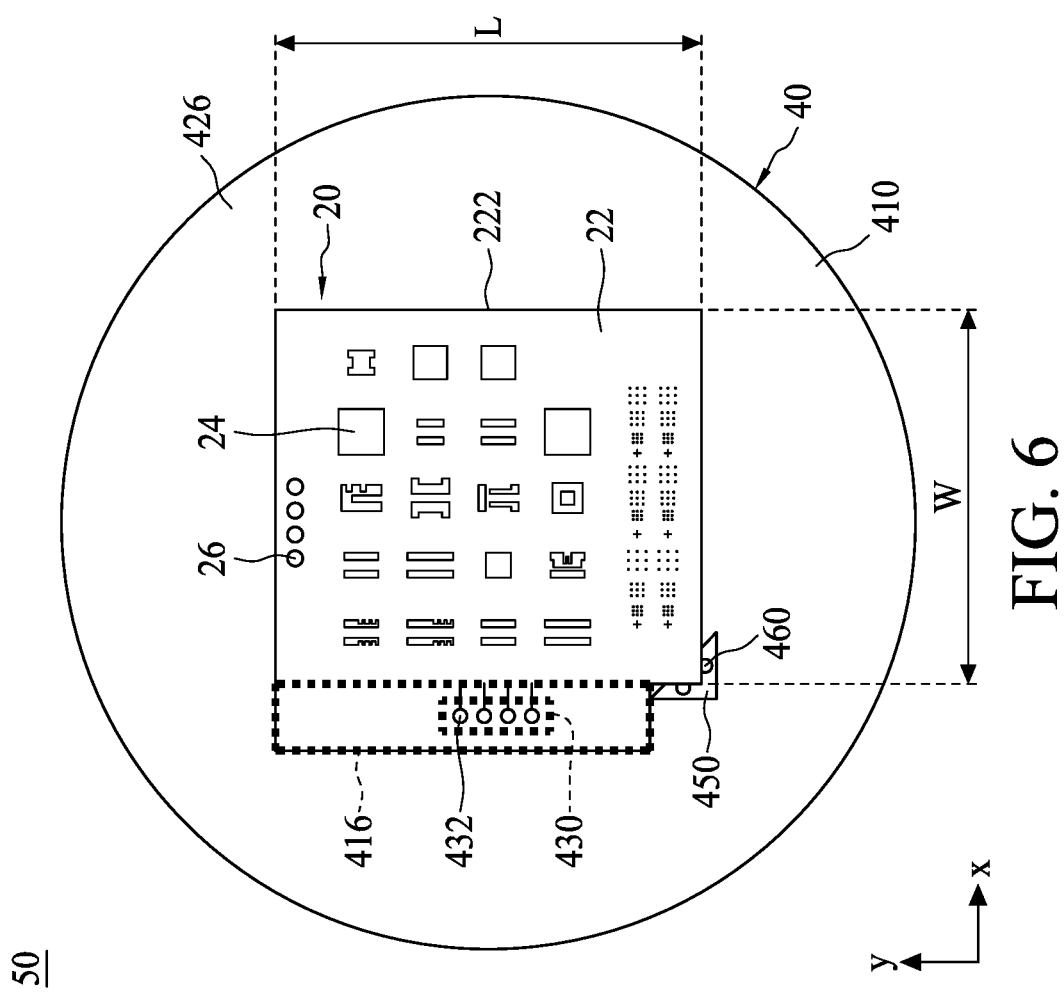
FIG. 6 is a top view of a testing assembly in accordance with some embodiments of the present disclosure.

The testing fixture 40 is adapted to holding a DUT 20, as shown in FIGS. 6 to 9, and thus a testing assembly 50 is formed. Referring to FIG. 6, The DUT 20 includes a PCB 22 and multiple electronic components 24 mounted on the PCB 22. The DUT 20 further includes a plurality of plated through holes 26 drilled completely through the PCB 22, metallized and electrically coupled to electronic components 24 through electrical traces (not shown) placed on or buried in the PCB 22. In some embodiments, the number of the electrical contacts 432 in one set of electrical contacts 430 is equal to a number of the plated through holes 26 through the PCB 22, and the plated through holes 26 are aligned with and in contact with the electrical contacts 432 in one of the sets of electrical contacts 430 when the DUT 20 is assembled with the testing fixture 50 to facilitate performing a probing operation.

The PCB 22 has a perimeter 222. In some embodiments, the perimeter 222 forms a rectangle having a width W and a length L greater than the width W. In some embodiments, the width W is about 10.5 cm, and the length L is about 12 cm. In some embodiments, the plated through holes 26 are provided at one shorter side of the PCB 22.

Figure 7:
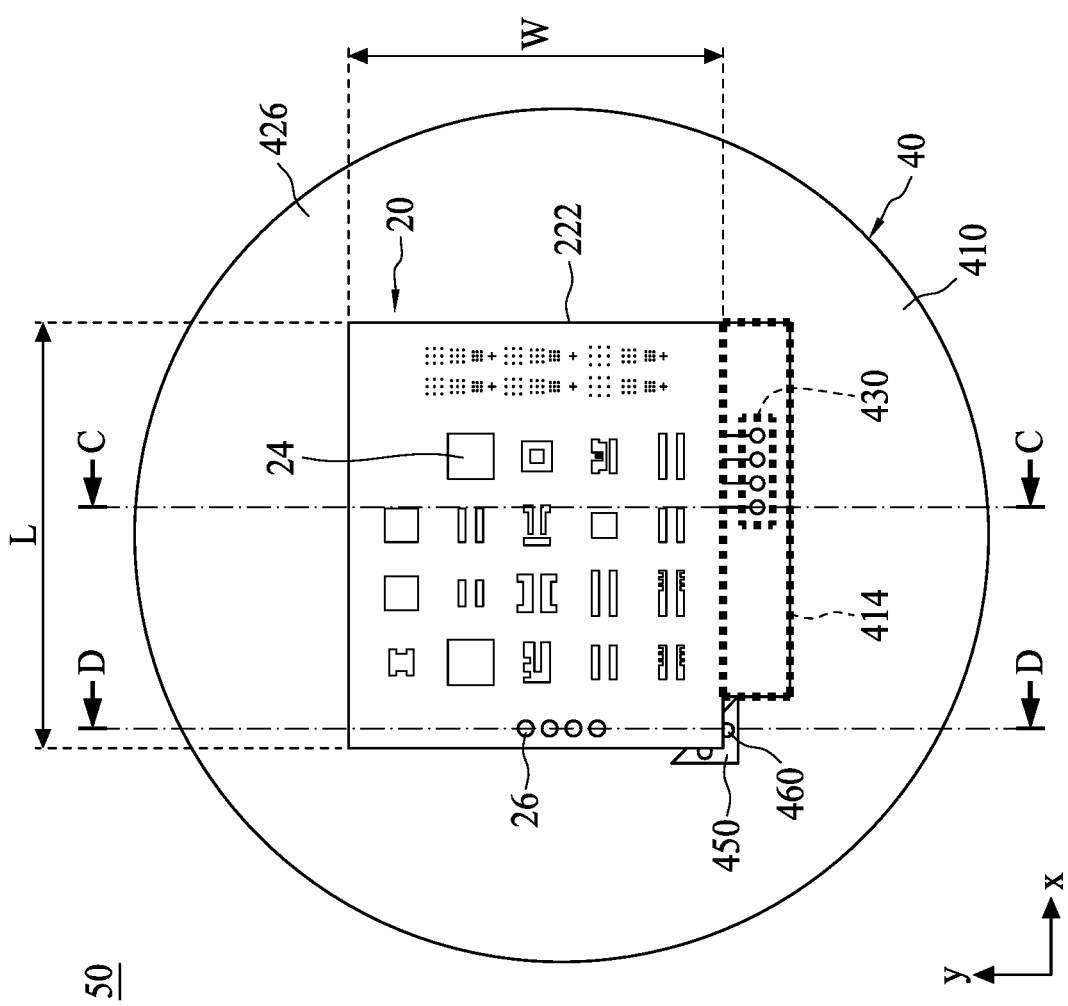
FIG. 7 is a top view of a testing assembly in accordance with some embodiments of the present disclosure.
Figure 8:
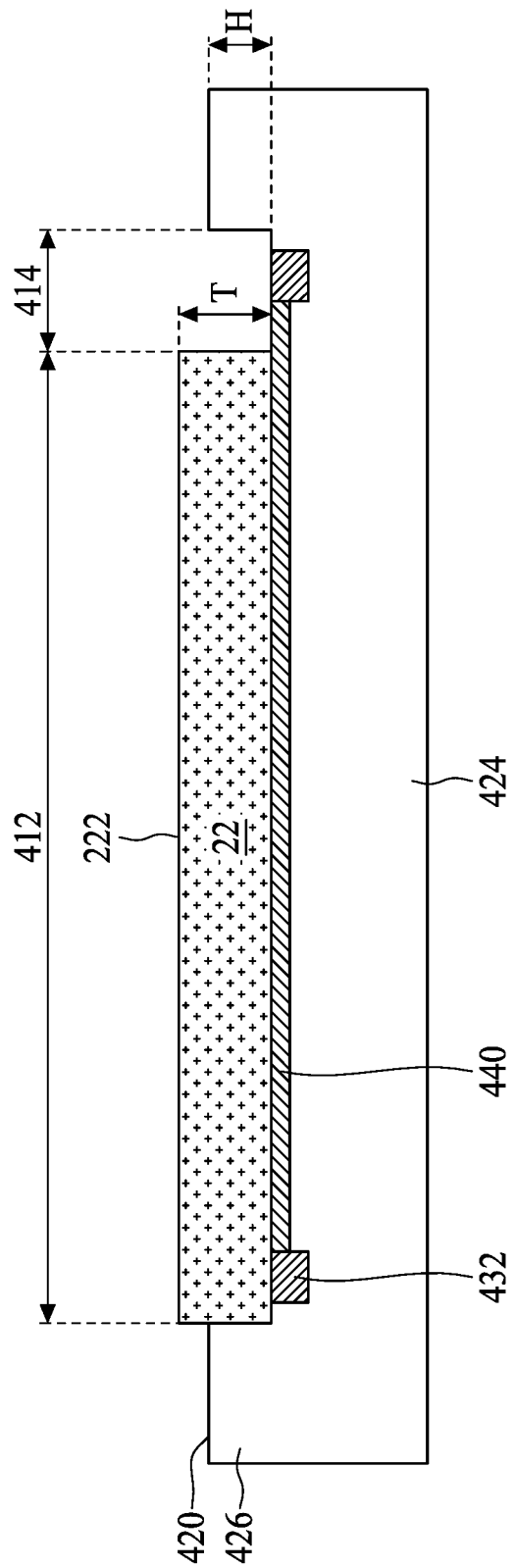
FIG. 8 is a cross-sectional view taken along the line C-C illustrated in FIG. 7.

When the DUT 20 is assembled with the testing fixture 40, the PCB 22 can occupy the first recess 412 and the second recess 414 as shown in FIG. 6, or can occupy the first recess 412 and the third recess 416 as shown in FIG. 7. This results in improving the assembly degree of freedom of the DUT 20 and the testing fixture 40. Specifically, the plated through holes 26 of the DUT 20 can be in contact with any one of the sets of electrical contacts 430 since the plurality of sets of electrical contacts 430 on the base 4324 are arranged in a rotationally symmetrical manner. When the plated through holes 26 are in contact with the electrical contacts 432 arranged along the first direction x, as shown in FIG. 6, the DUT 20 occupies the first recess 412 and the second recess 414, wherein the set of electrical contacts 430 in the third recess 416 is exposed through the DUT 20. When the plated through holes 26 are in contact with the electrical contacts 432 arranged along the second direction y, as shown in FIG. 7, the DUT 20 occupies the first recess 412 and the third recess 416, wherein the set of electrical contacts 430 in the second recess 414 is exposed through the DUT 20.

Figure 9:
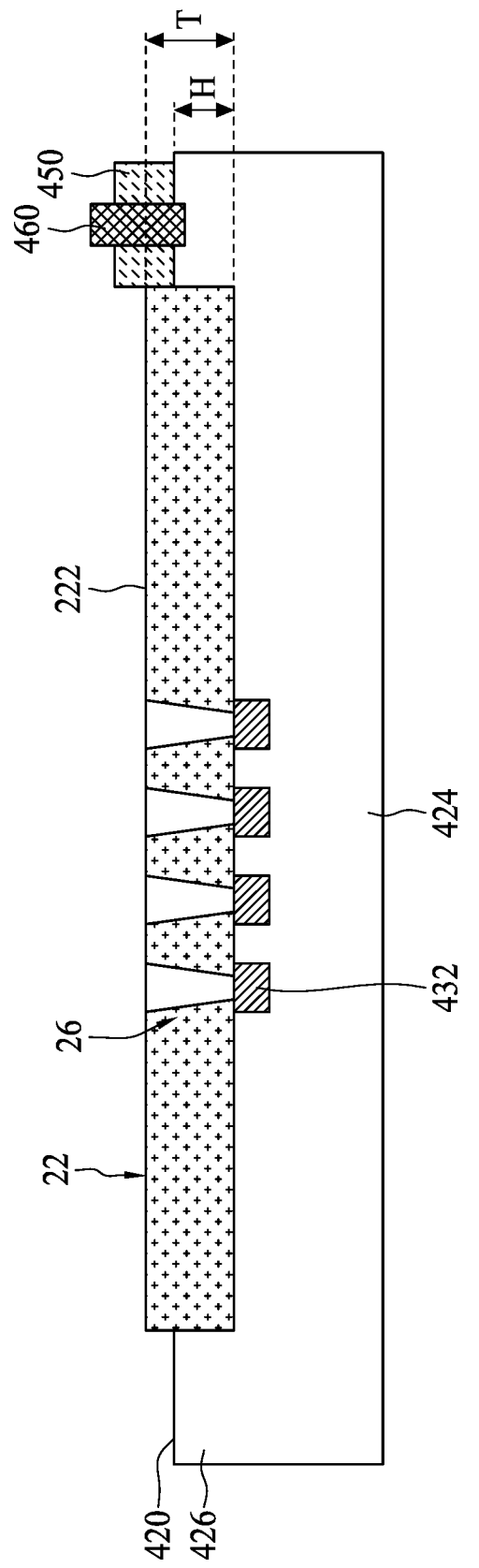
FIG. 9 is a cross-sectional view taken along the line D-D illustrated in FIG. 7.

Referring to FIGS. 6, 7 and 9, the testing fixture 40 may further include a fixed block 450 disposed on the frame 426 to block a corner of the PCB 22 and constrain a movement of the DUT 20 when a thickness T of the PCB 22 is greater than a height H of the frame 426. In some embodiments, the fixed block 450 blocks the corner of the PCB 22 in the second recess 414 and close to the third recess 416 when the DUT 20 occupies the first recess 414 and the second recess 414, as shown in FIG. 6; the fixed block 450 blocks the corner of the PCB 22 in the third recess 416 and close to the second recess 414 when the DUT 20 occupies the first recess 414 and the third recess 416, as shown in FIG. 7.

Referring again to FIGS. 6, 7 and 9, in some embodiments, the testing fixture 40 may also include one or more fastening members 460, such as screws, locking the fixed block 450 to the frame 426 so as to effectively prevent the DUT 20 from separating from the testing fixture 40 during operation.

Figure 10:
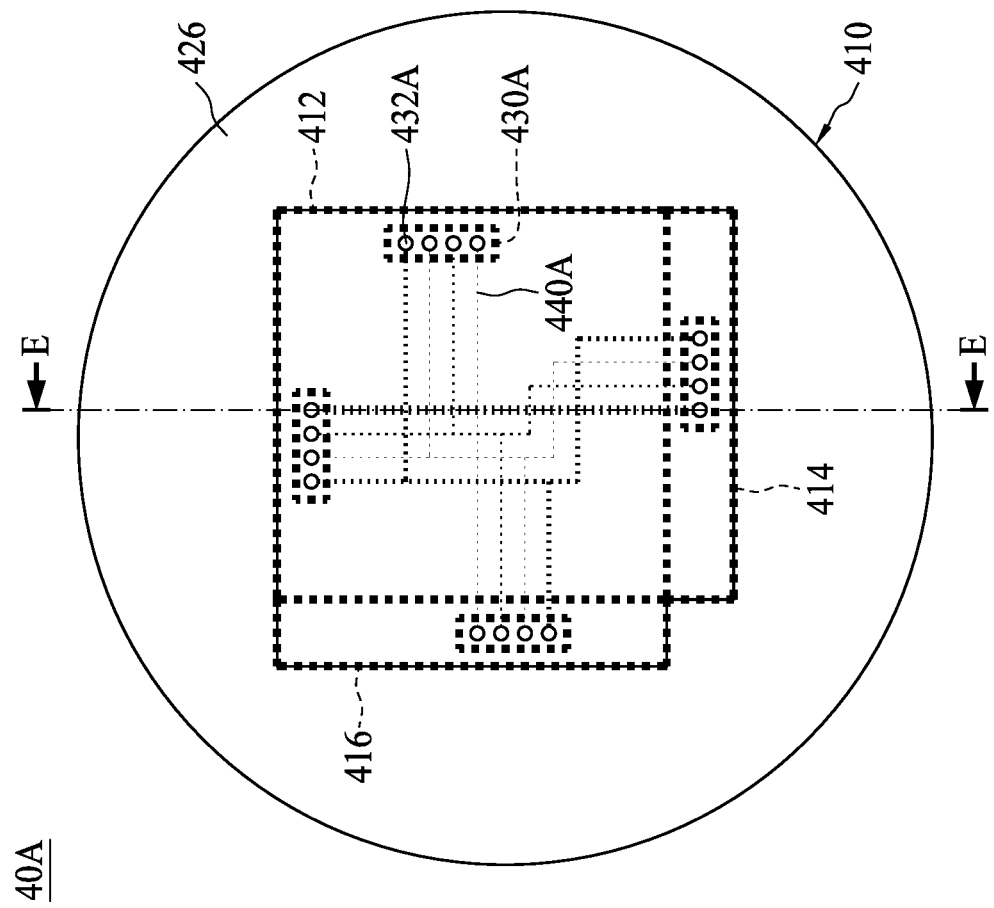
FIG. 10 is a top view of a testing fixture in accordance with some embodiments of the present disclosure.
Figure 11:
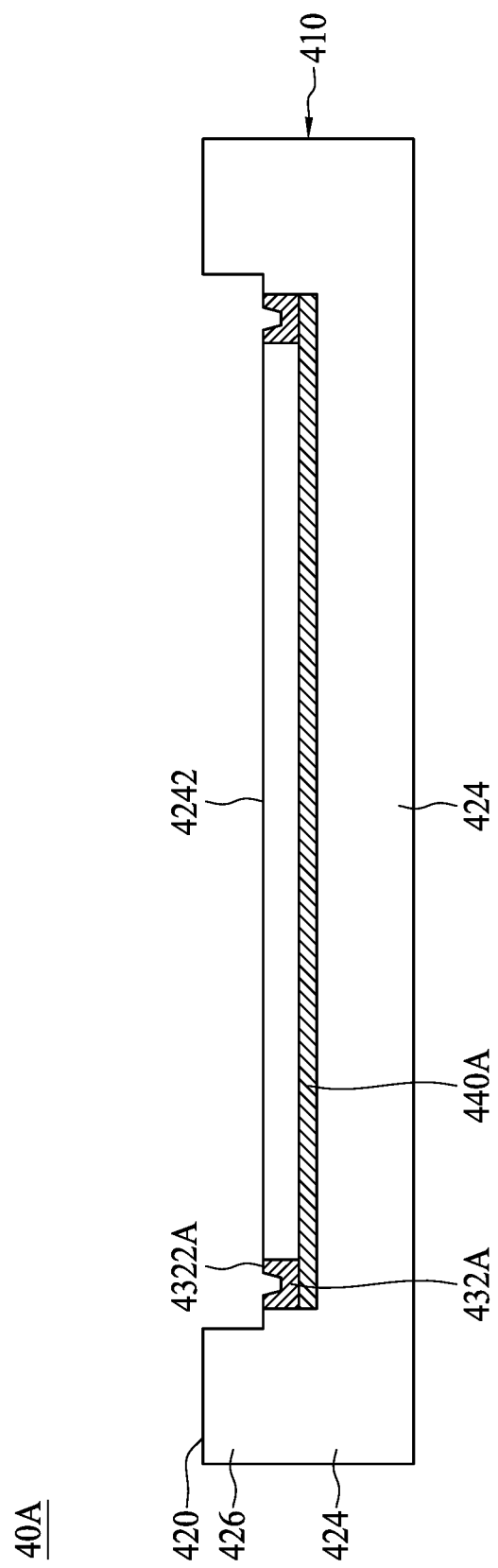
FIG. 11 is a cross-sectional view taken along the line E-E illustrated in FIG. 10.

FIG. 10 is a top view of a testing fixture 40A in accordance with some embodiments of the present disclosure, and FIG. 11 is a cross-sectional view taken along the line E-E illustrated in FIG. 10. Referring to FIGS. 10 and 11, the testing fixture 40A, adapted to hold a DUT 20, includes a carrier 410, a plurality of sets of electrical contacts 430A and a plurality of electrical lines 440A. The configuration of the carrier 410 in these embodiments is essentially the same as the configurations of the like components, which are denoted by like reference numerals in the embodiments shown in FIGS. 3 and 4. The details of the like components shown in FIGS. 10 and 11 may thus be found in the discussion of the embodiments shown in FIGS. 3 and 4.

Referring to FIGS. 10 and 11, in some embodiments, the plurality of sets of electrical contacts 430A includes a plurality of electrical contacts 432A disposed on the base 424 and arranged in a rotationally symmetrical manner. In these embodiments, the electrical contact 432A has a top surface 4322A, which is recessed downward to latch a head of testing probe, thereby preventing the head from being displaced during operation. In addition, the electrical lines 440A are buried in the base 424 and contact the electrical contacts 432A, which increases the neat appearance.

In conclusion, the testing fixture 40/40A including the plurality of sets of electrical contacts 430 arranged in a rotationally symmetrical manner allows the DUT 20 to be mounted on the testing fixture 40/40A in various orientations, which improves the assembly degree of freedom.

One aspect of the present disclosure provides a testing fixture. The testing fixture includes a base, a frame, a plurality of sets of electrical contacts and a plurality of electrical lines. The frame extends along an upper surface of the base. The base and the frame collectively define a first recess, a second recess extending longitudinally from the first recess, and a third recess extending transversely from the first recess. The plurality of sets of electrical contacts are disposed on the base and arranged in a rotationally symmetrical manner. The plurality of electrical lines are electrically connected to the plurality of sets of electrical contacts.

One aspect of the present disclosure provides a testing assembly. The testing assembly includes a device under test (DUT) and a testing fixture. The DUT includes a printed circuit board (PCB), at least one electronic component mounted on the PCB, and a plurality of plated through holes penetrating through the PCB. The testing fixture includes a carrier, a plurality of sets of electrical contacts and a plurality of electrical lines. The carrier includes a base and a frame extending from an upper surface of the base. The base and the frame define a first recess, a second recess extending longitudinally from the first recess, and a third recess extending transversely from the first recess. The plurality of sets of electrical contacts are disposed on the base and arranged in a rotationally symmetrical manner, wherein the plurality of sets of electrical contacts are provided at positions corresponding to the plated through holes. The plurality of electrical lines are electrically connected to the plurality of sets of electrical contacts. When the DUT is assembled with the carrier, the DUT occupies the first recess and one of the second recess and the third recess, and the plurality of plated through holes are in contact with one of the plurality of sets of electrical contacts.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A testing fixture comprising:
   a base;
   a frame extending along an upper surface of the base, wherein the base and the frame define a first recess, a second recess extending longitudinally from the first recess, and a third recess extending transversely from the first recess;
   a plurality of sets of electrical contacts disposed on the base and arranged in a rotationally symmetrical manner; and
   a plurality of electrical lines electrically connected to the plurality of sets of electrical contacts;
   wherein the second recess is separated from the third recess.

2. The testing fixture of claim 1, wherein projections of the first recess, the second recess and the third recess on the base intersect at an intersection.

3. The testing fixture of claim 1, wherein at least one of the sets of electrical contacts is disposed in the second recess, and at least one of the sets of electrical contacts is disposed in the third recess.

4. The testing fixture of claim 1, wherein at least one of the plurality of electrical lines electrically connects at least one electrical contact of one of the sets of electrical contacts to at least one electrical contact of another one of the sets of electrical contacts arranged at a corresponding position.

5. The testing fixture of claim 1, wherein at least one the electrical contacts has a concave top surface.

6. The testing fixture of claim 1, wherein the electrical lines are connected to the upper surface of the base.

7. The testing fixture of claim 1, wherein the electrical lines are buried in the base.

8. The testing fixture of claim 1, wherein the base and the frame are integrally formed.

9. A testing assembly, comprising:
   a device under test (DUT) comprising a printed circuit board (PCB), at least one electronic component mounted on the PCB, and a plurality of plated through holes penetrating through the PCB; and
   a testing fixture, comprising:
   a carrier comprising a base and a frame extending from an upper surface of the base to define a first recess, a second recess extending longitudinally from the first recess, and a third recess extending transversely from the first recess;
   a plurality of sets of electrical contacts disposed on the base and arranged in a rotationally symmetrical manner, wherein the plurality of sets of electrical contacts are provided at positions corresponding to the plated through holes; and
   a plurality of electrical lines electrically connected to the plurality of sets of electrical contacts,
   wherein when the DUT is assembled with the carrier, the DUT occupies the first recess and one of the second recess and the third recess, and the plurality of plated through holes are in contact with one of the plurality of sets of electrical contacts;
   wherein the testing fixture further comprises a fixed block disposed on the frame and the fixed block contacts a corner of the PCB in the second recess or the third recess when a thickness of the PCB is greater than a height of the frame.

10. The testing assembly of claim 9, the fixed block blocks the corner of the PCB in the second recess and close to the third recess when the DUT occupies the first recess and the second recess, and the fixed block blocks the corner of the PCB in the third recess and close to the second recess when the DUT occupies the first recess and the third recess.

11. The testing assembly of claim 10, wherein the testing fixture further comprises at least one fastening member locking the fixed block to the frame.

12. The testing assembly of claim 9, wherein projections of the first recess, the second recess and the third recess on the base intersect at an intersection.

13. The testing assembly of claim 9, wherein at least one of the sets of electrical contacts is disposed in the second recess, and at least one of the sets of electrical contacts is disposed in the third recess.

14. The testing assembly of claim 9, wherein the electrical line connects electrical contacts of the plurality of sets of electrical contacts to other electrical contacts in corresponding positions of the plurality of sets of electrical contacts.

15. The testing assembly of claim 9, wherein the electrical lines are connected to the upper surface of the base.

16. The testing assembly of claim 9, wherein the electrical lines are buried in the base.

\* \* \* \* \*